(12) United States Patent
Iwata et al.

(10) Patent No.: US 9,237,669 B2
(45) Date of Patent: Jan. 12, 2016

(54) POWER CONVERTER

(75) Inventors: Kunihiro Iwata, Ichinomiya (JP); Makoto Okamura, Nisshin (JP)

(73) Assignees: TOYOTA JIDOSHA KABUSHIKI KAISHA, Aichi-ken (JP); DENSO CORPORATION, Aichi-ken (JP)

( * ) Notice: Subject to any disclaimer, the term of this patent is extended or adjusted under 35 U.S.C. 154(b) by 158 days.

(21) Appl. No.: 14/119,215

(22) PCT Filed: May 24, 2012

(86) PCT No.: PCT/IB2012/001005
§ 371 (c)(1),
(2), (4) Date: Nov. 21, 2013

(87) PCT Pub. No.: WO2012/164365
PCT Pub. Date: Dec. 6, 2012

(65) Prior Publication Data
US 2014/0185266 A1  Jul. 3, 2014

(30) Foreign Application Priority Data
May 30, 2011  (JP) .................................. 2011-120093

(51) Int. Cl.
H05K 7/20 (2006.01)
H05K 7/02 (2006.01)
H02M 7/00 (2006.01)
(Continued)

(52) U.S. Cl.
CPC .............. *H05K 7/023* (2013.01); *B60L 11/123* (2013.01); *B60L 11/1803* (2013.01); *B60L 15/007* (2013.01); *H02M 7/003* (2013.01); *H05K 7/1432* (2013.01); *B60L 2210/40* (2013.01);
(Continued)

(58) Field of Classification Search
CPC ...... H02M 7/003; H05K 7/1432; H05K 7/023

USPC .......... 363/141, 144; 361/637, 688, 719, 722, 361/728, 729, 734
See application file for complete search history.

(56) References Cited

U.S. PATENT DOCUMENTS

| 7,542,318 B2* | 6/2009 | Otsuka et al. ................. 363/178 |
| 8,169,780 B2* | 5/2012 | Yoshino et al. ............... 361/699 |
| 2014/0085955 A1* | 3/2014 | Maeda et al. ................. 363/132 |
| 2014/0153189 A1* | 6/2014 | Okamura ...................... 361/688 |

FOREIGN PATENT DOCUMENTS

| JP | 2003-319665 A | 11/2003 |
| JP | 2005-176555 A | 6/2005 |

(Continued)

*Primary Examiner* — Matthew Nguyen
(74) *Attorney, Agent, or Firm* — Sughrue Mion, PLLC

(57) ABSTRACT

A positive-electrode connecting plate (66) that connects positive-electrode terminals (28, 36, 48) of a plurality of power converter circuits is provided with slits (100, 102). The positive-electrode connecting plate has a positive-electrode bus bar portion (78) on which a first inverter corresponding region (94) that is connected to the positive-electrode terminal (36) of a first inverter as one of the power converter circuits via a positive-electrode connecting piece (80a), a second inverter corresponding region (96) that is connected to the positive-electrode terminal (48) of a second inverter as one of the power converter circuits via a positive-electrode connecting piece (80b) and a boost converter corresponding region (98) that is connected to the positive-electrode terminal (28) of a boost converter as one of the power converter circuits via a positive-electrode connecting piece (80c) are defined. The slits extend from an edge (82) of the positive-electrode bus bar portion along the boundaries between the regions.

10 Claims, 8 Drawing Sheets

(51) Int. Cl.
    *H05K 7/14*        (2006.01)
    *B60L 11/12*      (2006.01)
    *B60L 11/18*      (2006.01)
    *B60L 15/00*      (2006.01)

(52) U.S. Cl.
    CPC .......... *Y02T10/6217* (2013.01); *Y02T 10/7005* (2013.01); *Y02T 10/7022* (2013.01); *Y02T 10/7077* (2013.01); *Y02T 10/7241* (2013.01)

(56) References Cited

FOREIGN PATENT DOCUMENTS

| JP | 2006-295997 A | 10/2006 |
| JP | 2010-115061 A | 5/2010 |
| JP | 2010-259229 A | 11/2010 |

* cited by examiner

POWER CONVERTER

BACKGROUND OF THE INVENTION

1. Field of the Invention

The present invention relates to a power converter that converts AC power into DC power and converts DC power into AC power, and converts voltage.

2. Description of Related Art

A power converter circuit which converts DC power into AC power or converts AC power into DC, that is, an inverter is known. A power converter circuit which raises or lowers a DC voltage, that is, a boost converter is also known. A plurality of power converter circuits which change a characteristic of electric power (AC/DC, voltage, etc.) are sometimes integrally combined to constitute an power converter.

One example of the use of a power converter is in a hybrid vehicle which is equipped with an internal combustion engine and an electric motor as driving sources. A three-phase AC synchronous motor is sometimes used as the electric motor for a hybrid vehicle. The electric motor functions also as a power generator to generate electric power when its rotating shaft is driven by the inertia of the vehicle. In the following description, an electrical device which corresponds to a concept which includes an electric motor, a power generator, and an electrical device which can function as an electric motor and a power generator is referred to as "rotating electric machine." An inverter is used to drive a rotating electric machine with a DC power source, such as a secondary battery, which is mounted on a vehicle, or to charge a secondary battery with the electric power that is regenerated by the rotating electric machine. A boost converter is sometimes provided to boost the terminal voltage of the secondary battery and supply the boosted voltage to an electric motor. In addition, a hybrid vehicle which is equipped with two rotating electric machines is known, in which case, an inverter is used for each of the two electric motors.

Such a power converter circuit is constituted using semiconductor modules which include IGBT elements, for example. Japanese Patent Application Publication No. 2006-295997 (JP 2006-295997 A) discloses a device in which terminals of a plurality of semiconductor modules which constitutes a power converter are connected by a bus bar.

When a plurality of power converter circuits are combined to constitute a power converter and terminals of semiconductor modules of the power converter circuits are connected by a bus bar, interference may be caused between the power converter circuits by a surge voltage.

SUMMARY OF THE INVENTION

The present invention provides a power converter in which interference between power converter circuits caused by a surge voltage can be prevented.

A power converter according to a first aspect of the present invention includes a plurality of power converter circuits, each of which includes at least one semiconductor module, and the semiconductor modules are stacked. The power converter has bus bars in common with the semiconductor modules that connect the stacked semiconductor modules with a capacitor, and connecting members that are arranged along an edge of each of the bus bars and connect the edge of the bus bar with terminals of the semiconductor modules. Each of the bus bars includes converter circuit corresponding regions that are virtually divided for each of the power converter circuits that include the semiconductor modules that are connected to the bus bar by the connecting members. In other words, a region on the bus bar to which a terminal of a semiconductor module that is included in a power converter circuit is connected is defined as a converter circuit corresponding region. The converter circuit corresponding regions are defined in one-to-one correspondence with the plurality of power converter circuits. At least one of the bus bars has a slit that extends from the edge thereof along which the connecting members are arranged along at least one of the boundaries between the converter circuit corresponding regions.

According to the first aspect, the slits of the bus bars increase the length of current paths between power converter circuits, which reduces the influence of a surge voltage on other power converter circuits.

In the above aspect, one of the bus bars with the slit may be connected to positive-electrode terminals of the semiconductor modules.

In the above aspect, the plurality of power converter circuits may include a first power converter circuit that includes a first inverter that is provided corresponding to a first rotating electric machine and a second power converter circuit that includes a second inverter that is provided corresponding to a second rotating electric machine. The converter circuit corresponding regions of each of the bus bars may include a first inverter corresponding region that corresponds to the first inverter and a second inverter corresponding region that corresponds to the second inverter, and the slit may be provided between the first inverter corresponding region and the second inverter corresponding region.

The plurality of power converter circuits may further include a third power converter circuit that includes a boost converter that includes a semiconductor module which is located between the semiconductor module of the first inverter and the semiconductor module of the second inverter. The converter circuit corresponding regions of each of the bus bars may include a boost converter corresponding region and the slits that are provided between the first inverter corresponding region and the boost converter corresponding region and between the second inverter corresponding region and the boost converter corresponding region.

In the above aspect, the slit that is provided between the first inverter corresponding region and the boost converter corresponding region has a length that may be determined based on the current that will flow between the first inverter corresponding region and the boost converter corresponding region and the upper limit of the amount of heat generation from the bus bar, and the slit that is provided between the second inverter corresponding region and the boost converter corresponding region has a length that may be determined based on the current that will flow between the second inverter corresponding region and the boost converter corresponding region and the upper limit of the amount of heat generation from the bus bar. That is, each of the slits has a length that may be determined based on the current that will flow through the portion of the bus bar that is narrowed because of the slit and the upper limit of the amount of heat generation from this portion. In a power converter circuit in which a semiconductor module that is included in a boost converter is interposed between semiconductor modules that are included in two inverters, the length of a slit that is provided between one of the inverter corresponding regions and a boost converter corresponding region on a bus bar may be determined based on the current that flows between the corresponding regions and the upper limit of the amount of heat generation from the bus bar.

A power converter according to a second aspect of the present invention includes a plurality of power converter circuits, each of which includes at least one semiconductor module, and the semiconductor modules are stacked. The power converter also has bus bars that connect terminals of the stacked semiconductor modules and connecting members that are arranged along an edge of each of the bus bars and connect the edge of the bus bar with a corresponding one of the terminals of the plurality of the power converter circuits. Each of the bus bars includes converter circuit corresponding regions that are defined for each of the power converter circuits that include the semiconductor modules that are connected to the bus bar by the connecting members. At least one of the bus bars includes a slit that extends from the edge of the bus bar along at least one of the boundaries between the converter circuit corresponding regions.

A power converter according to a third aspect of the present invention includes a plurality of power converter circuits, each of which includes at least one semiconductor module, and the semiconductor modules are stacked. The power converter also has bus bars that connect terminals of the stacked semiconductor modules and connecting members that are arranged at equal spaces along an edge of each of the bus bars and connect the edge of the bus bar with a corresponding one of the terminals of the plurality of the power converter circuits. Each of the bus bars includes converter circuit corresponding regions that are defined for each of the power converter circuits that include the semiconductor modules that are connected to the bus bar by the connecting members. At least one of the bus bars has a curved portion that is provided along at least one of the boundaries between adjacent converter circuit corresponding regions configured to increase the length of current paths between the adjacent converter circuit corresponding regions.

A power converter according to a fourth aspect of the present invention includes a plurality of power converter circuits, each of which includes at least one semiconductor module, and the semiconductor modules are stacked. The power converter also includes connecting plates that connect terminals of the stacked semiconductor modules. Each of the connecting plates includes bus bar portions that extend in the direction in which the semiconductor modules are stacked, and connecting pieces that extend from the bus bar portion and connect the bus bar portion with the terminals of the semiconductor modules. The bus bar portion includes converter circuit corresponding regions that are defined for each of the power converter circuits that include the semiconductor modules that are connected via the connecting pieces. At least one of the bus bar portions has a slit that is formed along at least one of boundaries between the converter circuit corresponding regions and extends beyond the bases of the connecting pieces.

According to any of the above aspects, the means to increase the length of current path between two power converter circuits on the bus bar reduces interference between two power converter circuits that is caused by a surge voltage.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
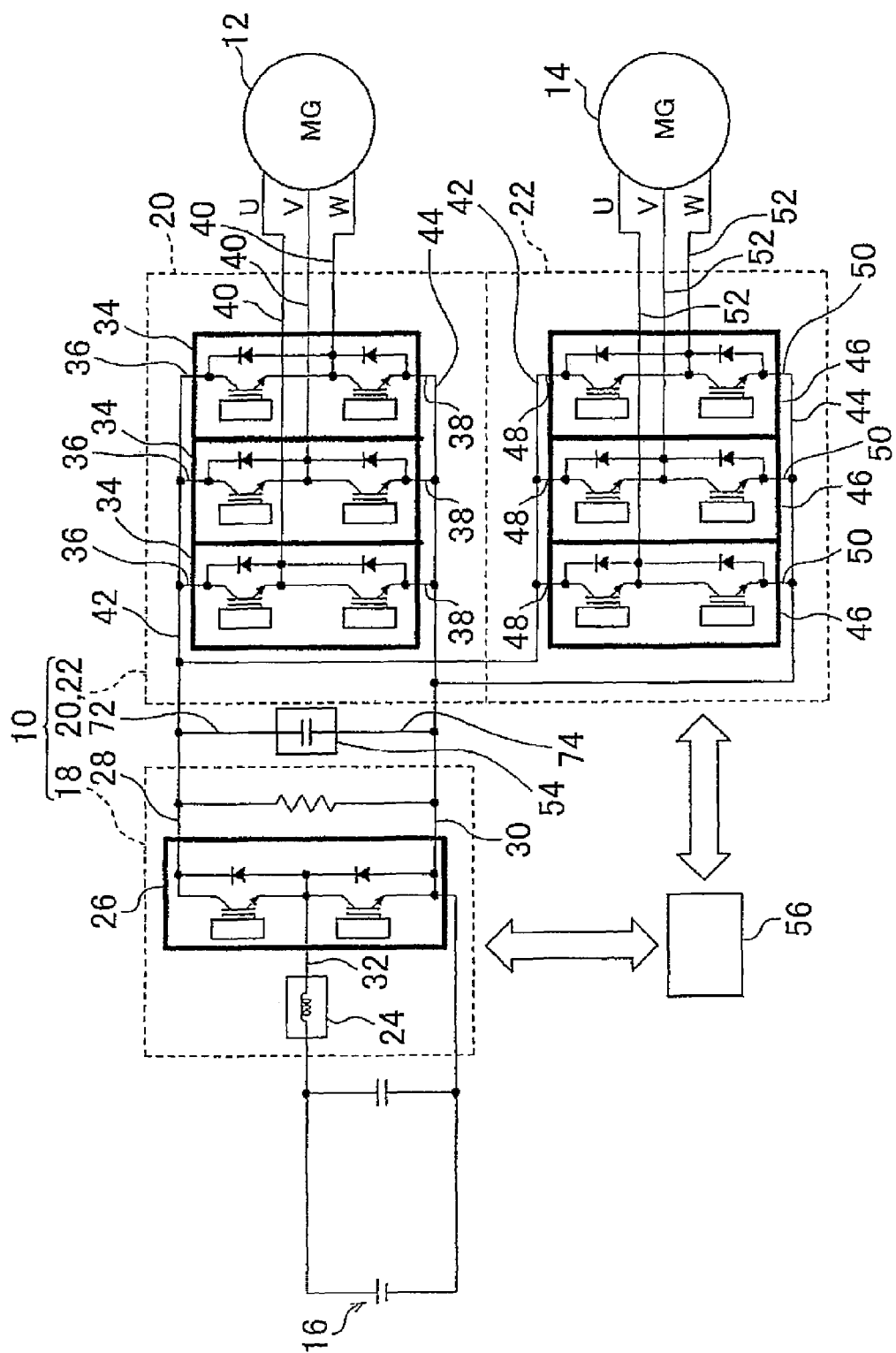
FIG. 1 is a circuit configuration diagram that includes a power converter of this embodiment.

Description is hereinafter made of an embodiment of the present invention with reference to the drawings. FIG. 1 is a circuit configuration diagram that includes a power converter 10 of this embodiment. FIG. 1 is a diagram that illustrates the circuit configuration of a control system that drives first and second rotating electric machines 12 and 14 which function as driving motors of a hybrid vehicle. The two rotating electric machines 12 and 14 are rotatably driven by electric power from a secondary battery 16, and the secondary battery 16 is charged with electric power that is generated by the rotating electric machines 12 and 14. It is the power converter 10 that is used to drive the rotating electric machines 12 and 14 and charge the secondary battery 16. The power converter 10 includes a boost converter 18 that boosts the voltage of the secondary battery 16, and inverters 20 and 22 that convert the DC power from the secondary battery 16 into three-phase AC power and convert the AC power that is generated by the first and second rotating electric machines 12 and 14 into DC power. The first inverter 20 is provided for the first rotating electric machine 12, and the second inverter 22 is provided for the second rotating electric machine 14. The boost converter 18 is a power converter or circuit that changes a characteristic value, voltage, of electric power, and the first and second inverters 20 and 22 are power converters or circuits that change a characteristic, AC or DC, of electric power. While both of the two rotating electric machines 12 and 14 of this embodiment function as an electric motor and a power generator, they may be rotating electric machines which function as either an electric motor or a power generator.

The boost converter 18 has at least one semiconductor module 26 that includes a reactor 24 and power transistors, such as IGBTs. The semiconductor module 26 has a positive-electrode terminal 28 that is connected to positive-electrode terminals of the first and second inverters 20 and 22, a negative-electrode terminal 30 that is connected to negative-electrode terminals of the inverters 20 and 22, and an output-electrode terminal 32 that is connected to the reactor 24.

The first inverter 20 has three semiconductor modules 34 of the same structure, each including power transistors, such as IGBTs. The three semiconductor modules 34 correspond respectively to the three phases of the three-phase AC power that is supplied to the first rotating electric machine 12. Each of the semiconductor modules 34 has a positive-electrode terminal 36, a negative-electrode terminal 38, and an output-electrode terminal 40. The positive-electrode terminals 36 of the three semiconductor modules 34 are connected to each other by a positive-electrode bus 42, and are also connected to the positive-electrode terminal 28 of the boost converter 18 by the positive-electrode bus 42. The negative-electrode terminals 38 of the three semiconductor modules 34 are connected each other by a negative-electrode bus 44, and are also connected to the negative-electrode terminal 30 of the boost converter 18 by the negative-electrode bus 44. The three output-electrode terminals 40 are respectively connected to three-phase power lines that supply electric power to coils of the first rotating electric machine 12.

The second inverter 22 has three semiconductor modules 46 of the same structure, each including power transistors, such as IGBTs. The three semiconductor modules 46 correspond respectively to the three phases of the three-phase AC power that is supplied to the second rotating electric machine 14. Each of the semiconductor modules 46 has a positive-electrode terminal 48, a negative-electrode terminal 50, and an output-electrode terminal 52. The positive-electrode terminals 48 of the three semiconductor modules 46 are connected to each other by the positive-electrode bus 42, and are also connected to the positive-electrode terminal 28 of the boost converter 18 by the positive-electrode bus 42. The negative-electrode terminals 50 of the three semiconductor modules 46 are connected each other by the negative-electrode bus 44, and are also connected to the negative-electrode terminal 30 of the boost converter 18 by the negative-electrode bus 44. The three output-electrode terminals 52 are respectively connected to three-phase power lines that supply electric power to coils of the second rotating electric machine 14.

A smoothing capacitor 54 is interposed between the positive-electrode bus 42 and the negative-electrode bus 44. In addition, the power converter 10 is also provided with a control device 56 that controls the operations of the boost converter 18 and the first and second inverters 20 and 22. The control device 56 controls the operations of the boost converter 18 and the first and second inverters 20 and 22 by controlling the power transistors of the semiconductor modules 26, 34 and 46.

Figure 2:
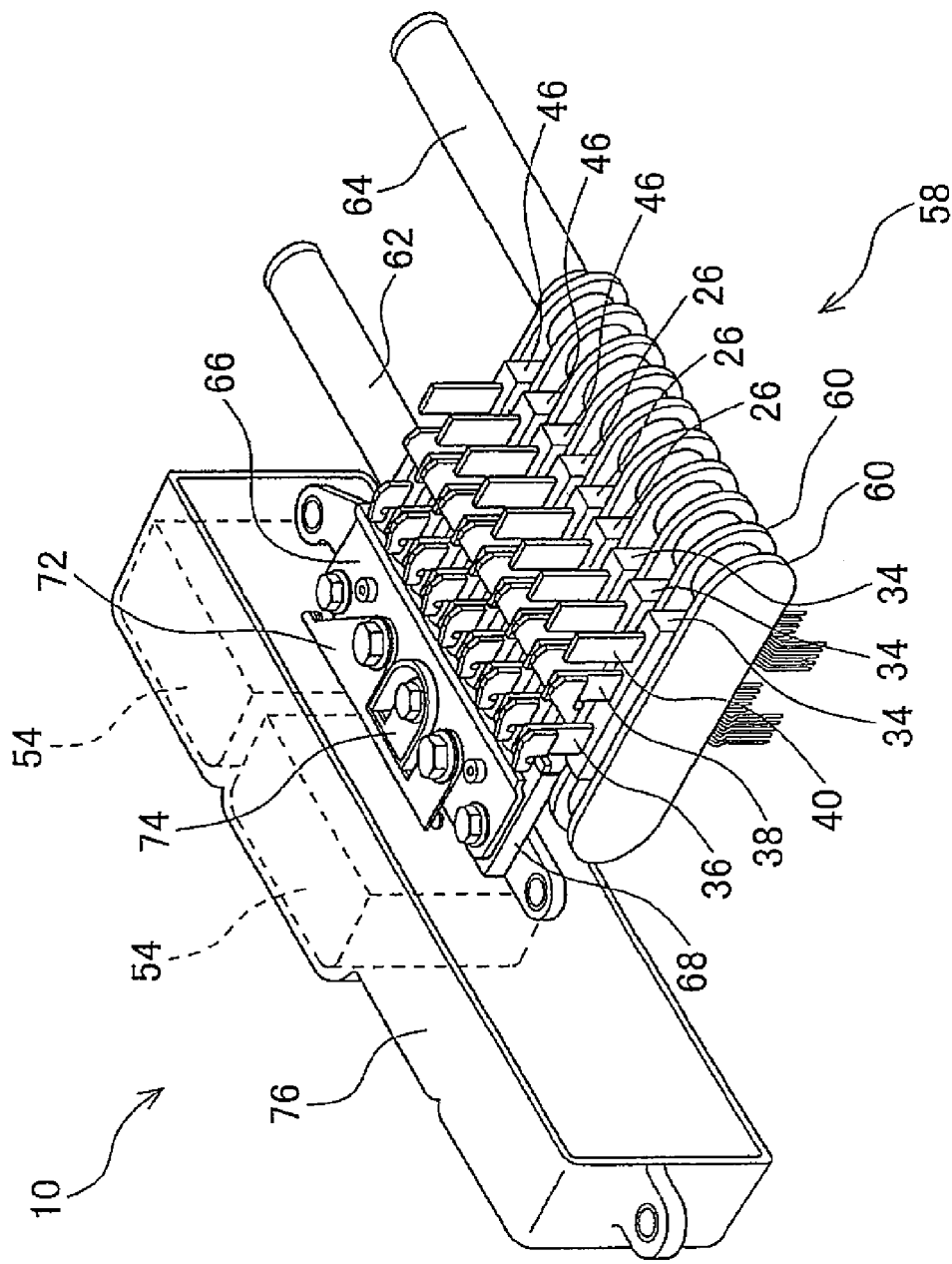
FIG. 2 is a perspective view that illustrates a part of the power converter of this embodiment.

FIG. 2 is a perspective view that illustrates the overview of a part of the power converter 10. The semiconductor modules 26, 34 and 46 of the boost converter 18 and the first and second inverters 20 and 22 are stacked to constitute a semiconductor module unit 58. Preferably, the semiconductor modules 26, 34 and 46 are stacked at equal spaces. The three semiconductor modules 34 of the first inverter 20 and the three semiconductor modules 46 of the second inverter 22 are located on both sides of three semiconductor modules 26 of the boost converter 18. The number of the semiconductor modules 34 and 46 of the first and second inverters are three because it corresponds to the number of phases of the three-phase AC power, whereas the number of the semiconductor modules 26 of the boost converter 18 is not limited to three. The number of the semiconductor modules 26 depends on the allowable current value of the elements, such as transistors, that are included in the semiconductor modules 26. The current per element can be reduced by increasing the number of the semiconductor modules, and the number of the modules is determined based on the use conditions.

The semiconductor modules 26, 34 and 46 are identical in appearance, and the terminals are located on the upper surfaces of the semiconductor modules 26, 34 and 46 as shown in FIG. 2. In the case of the semiconductor modules 34 of the first inverter, the positive-electrode terminal 36, the negative-electrode terminal 38 and the output-electrode terminal 40 are arranged in this order from back to front of FIG. 2. Although not shown for simplicity, the positive-electrode terminal 28 or 48, the negative-electrode terminal 30 or 50, and the output-electrode terminal 32 or 52 are also arranged in this order from back to front of FIG. 2 in the case of the semiconductor modules 26 of the boost converter and the semiconductor modules 46 of the second inverter. The electric wires that are connected to the output-electrode terminals are not shown. When the semiconductor modules 26, 34 and 46 are stacked at equal spaces, the terminals are also arranged at equal spaces.

The semiconductor module unit 58 also has a cooler that cools the semiconductor modules 26, 34 and 46. The cooler includes cooling plates 60 which are arranged to sandwich each of the semiconductor modules 26, 34 and 46, and coolant delivery pipes 62 and 64. The cooling plates 60 are hollow, and the spaces in the cooling plates 60 are in communication with the coolant delivery pipes 62 and 64. Coolant that is delivered through one coolant delivery pipe 62 is distributed to the cooling plates 60, flows in each of the cooling plates 60 and reaches the other coolant delivery pipe 64. The coolant that flows in the cooling plates 60 absorbs heat from the semiconductor modules 26, 34 and 46 to cool these semiconductor modules. The coolant that drains into the coolant delivery pipe 64 is fed through the coolant delivery pipe 64 to a radiator (not shown), and delivered to the cooling plates 60 again through the coolant delivery pipe 62 after being cooled in the radiator.

The positive-electrode terminals 28, 36 and 48 of the semiconductor modules are connected to a common positive-electrode connecting plate 66. The positive-electrode connecting plate 66 is fixed and supported on an upper surface of a fixed base 68. The negative-electrode terminals 30, 38 and 50 are connected to a common negative-electrode connecting plate 70. The negative-electrode connecting plate 70 (refer to FIG. 3 and FIG. 4) is fixed and supported on a lower surface of the fixed base 68. Thus, the negative-electrode connecting plate 70 is hidden behind the fixed base 68 and cannot be seen in FIG. 2. The positive-electrode connecting plate 66 is connected to a capacitor positive-electrode terminal 72, and the negative-electrode connecting plate 70 is connected to a capacitor negative-electrode terminal 74. Each of the capacitor positive-electrode terminal 72 and the capacitor negative-electrode terminal 74 is connected to the capacitor 54, which is housed in a capacitor case 76, within the case.

Figure 3:
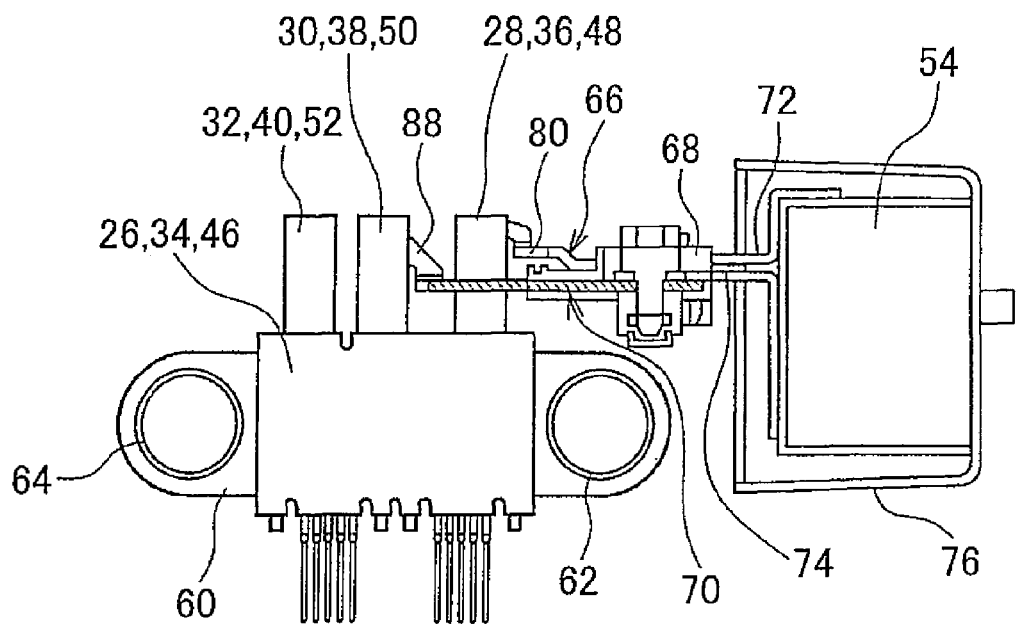
FIG. 3 is a side cross-sectional view that illustrates a part of the power converter of this embodiment.

FIG. 3 is a diagram that illustrates a cross-section perpendicular to the direction in which the semiconductor modules 26, 34 and 46 are stacked. As shown in FIG. 3, the negative-electrode connecting plate 70 is on the lower surface of the fixed base 68. It can be also understood that the capacitor positive-electrode terminal 72 and the capacitor negative-electrode terminal 74 extend into the capacitor case 76 and are connected to the capacitor 54.

Figure 4:
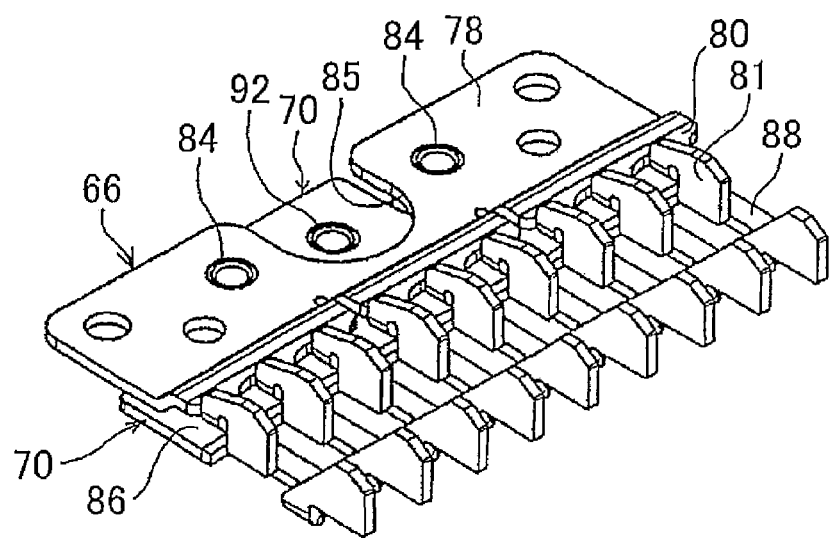
FIG. 4 is a perspective view that illustrates a positive-electrode connecting plate and a negative-electrode connecting plate.
Figure 5:
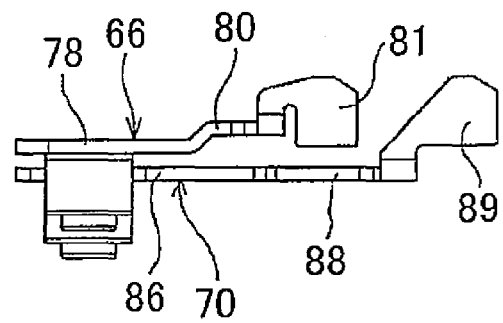
FIG. 5 is a side view that illustrates a positive-electrode connecting plate and a negative-electrode connecting plate.
Figure 6:
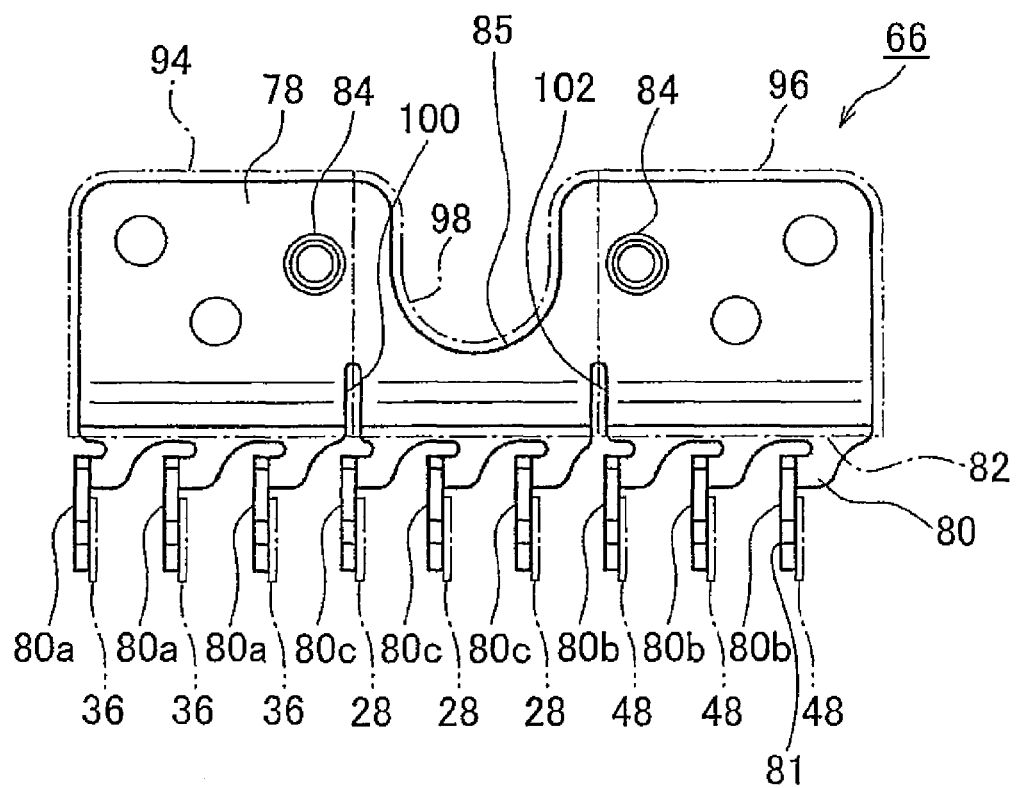
FIG. 6 is a plan view of the positive-electrode connecting plate.
Figure 7:
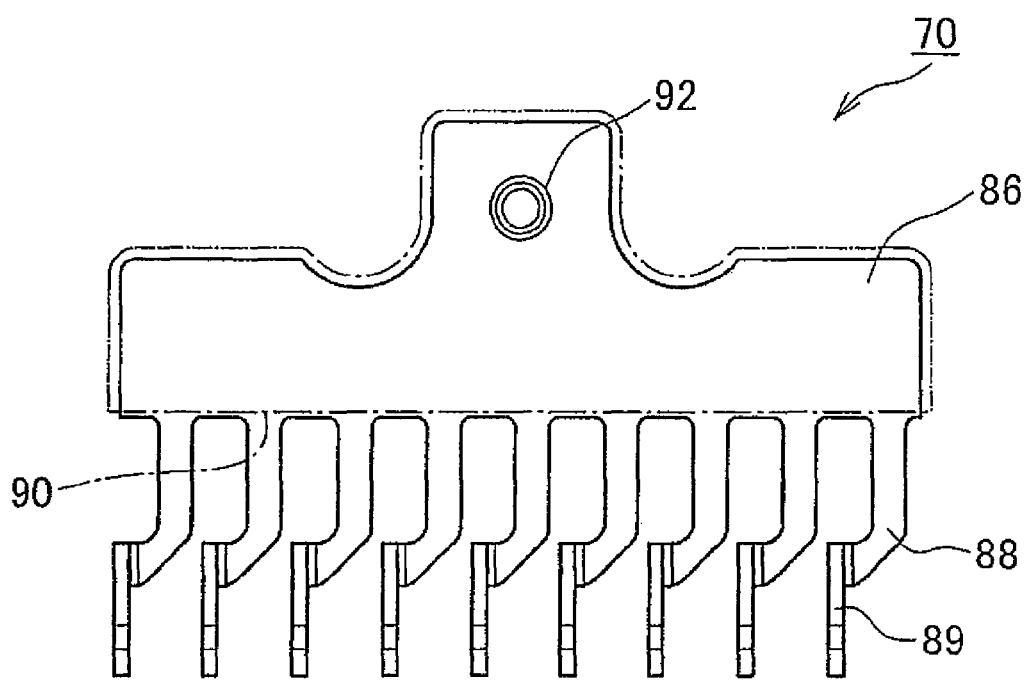
FIG. 7 is a plan view of the negative-electrode connecting plate.

FIG. 4 and FIG. 5 are diagrams that illustrate the positive-electrode connecting plate 66 and the negative-electrode connecting plate 70 alone. FIG. 6 is a plan view of the positive-electrode connecting plate 66, and FIG. 7 is a plan view of the negative-electrode connecting plate 70.

The positive-electrode connecting plate 66 includes a plate-like portion 78 that extends in the direction in which the semiconductor modules are stacked, and positive-electrode connecting pieces 80 that extend from an edge of the plate-like portion 78 which faces the positive-electrode terminals 28, 36 and 48 of the semiconductor modules. The plate-like portion 78 is a common conductor for the positive-electrode terminals 28, 36 and 48 of the semiconductor modules and functions as a bus bar. This part is hereinafter referred to as "positive-electrode bus bar portion 78." The positive-electrode bus bar portion 78 is the portion that is surrounded by dot-and-dash lines in FIG. 6. The positive-electrode connecting pieces 80, which are provided, one for each of the positive-electrode terminals 28, 36 and 48, are aligned along the direction in which semiconductor module are stacked and connected to a corresponding one of the positive-electrode terminals. When the positive-electrode terminals 28, 36 and 48 are arranged at equal spaces, it is preferred that the positive-electrode connecting pieces 80 are also arranged at equal spaces. Each of the positive-electrode connecting pieces 80 extends from an edge 82 of the positive-electrode bus bar portion 78 to extend the bus bar portion 78, and has an end portion 81 which is formed by bending the extended end thereof. The end portions 81 extend perpendicular to a plate surface of the bus bar portion 78, that is, parallel to the positive-electrode terminals 28, 36 and 48 of the semiconductor modules. A surface of the end portion 81 of each of the positive-electrode connecting pieces is fixed in close contact with a plate surface of a corresponding one of the positive-electrode terminals 28, 36 and 48.

The positive-electrode bus bar portion 78 has capacitor connection spots 84 to which the capacitor positive-electrode terminal 72 is coupled. Two capacitor connection spots 84 are provided, and a recess 85 that is formed by cutting the edge opposite the edge 82, from which the positive-electrode connecting pieces 80 extend, is provided between the capacitor connection spots 84. The capacitor positive-electrode terminal 72 and the positive-electrode connecting plate 66 are coupled to each other by bolts as shown in FIG. 2.

The positive-electrode connecting plate 66 functions as the positive-electrode bus 42, which connects the positive-electrode terminals 28, 36 and 48 of the semiconductor modules with the capacitor positive-electrode terminal 72. The positive-electrode bus bar portion 78 and the positive-electrode connecting pieces 80 may be integrally formed from a piece of metal plate by punching and bending, for example. Separately-formed connecting members may be connected to a positive-electrode bus bar portion that is formed from a metal plate. The connecting members may be formed from a material other than a metal plate, such as a conductive wire.

The negative-electrode connecting plate 70 includes a plate-like portion 86 that extends in the direction in which the semiconductor modules are stacked, and negative-electrode connecting pieces 88 that extend from an edge of the plate-like portion 86 which faces the negative-electrode terminals 30, 38 and 50 of the semiconductor modules. The plate-like portion 86 is a common conductor for the negative-electrode terminals 30, 38 and 50 of the semiconductor modules and functions as a bus bar. This part is hereinafter referred to as "negative-electrode bus bar portion 86." The negative-electrode bus bar portion 86 is the portion that is surrounded by dot-and-dash lines in FIG. 7. The negative-electrode connecting pieces 88, which are provided, one for each of the negative-electrode terminals 30, 38 and 50, are aligned along the direction in which semiconductor module are stacked and connected to a corresponding one of the negative-electrode terminals. When the negative-electrode terminals 30, 38 and 50 are arranged at equal spaces, it is preferred that the negative-electrode connecting pieces 88 are also arranged at equal spaces. Each of the negative-electrode connecting pieces 88 extends from an edge 90 of the negative-electrode bus bar portion 86 to extend the bus bar portion 86, and has an end portion 89 which is formed by bending the extended end thereof. The end portions 89 extend perpendicular to a plate surface of the bus bar portion 86, that is, parallel to the negative-electrode terminals 30, 38 and 50 of the semiconductor modules. A surface of the end portion 89 of each of the negative-electrode connecting pieces is fixed in close contact with a plate surface of a corresponding one of the negative-electrode terminals 30, 38 and 50.

The negative-electrode bus bar portion 86 has a capacitor connection spot 92 to which the capacitor negative-electrode terminal 74 is coupled. One capacitor connection spot 92 is provided at a position corresponding to the position of the recess 85 of the positive-electrode connecting plate 66. Thus, the capacitor connection spot 92 is exposed upward as shown in FIG. 4, and the negative-electrode connecting plate 70 can be secured with a bolt from above as shown in FIG. 2. As shown in FIG. 7, the width of the negative-electrode bus bar portion 86 is large around the capacitor connection spot 92 and small at both sides. The narrow portions provide spaces for the bolts that are used to secure the positive-electrode connecting plate 66 to extend through. The capacitor negative-electrode terminal 74 and the negative-electrode connecting plate 70 are coupled to each other by a bolt as shown in FIG. 2.

As described above, because the positive-electrode bus bar portion 78 has two capacitor connection spots 84 and the negative-electrode bus bar portion 86 has one capacitor connection spot 92, the negative-electrode bus bar portion 86 can be reduced in size as compared to the case where both the positive-electrode bus bar portion 78 and the negative-electrode bus bar portion 86 have two capacitor connection spots. The positive-electrode bus bar portion may have one capacitor connection spot and the negative-electrode bus bar portion may have two capacitor connection spots.

The negative-electrode connecting plate 70 functions as the negative-electrode bus 44, which connects the negative-electrode terminals 30, 38 and 50 of the semiconductor modules with the capacitor negative-electrode terminal 74. The negative-electrode bus bar portion 86 and the negative-electrode connecting pieces 88 can be integrally formed from a piece of metal plate by punching and bending, for example. Separately-formed connecting members may be connected to a negative-electrode bus bar portion that is formed from a metal plate. The connecting members may be formed from a material other than a metal plate, such as a conductive wire.

The positive-electrode terminals 28, 36 and 48 of the semiconductor modules are shown in FIG. 6. Suffixes "a," "b" and "c" are attached to the reference numeral 80 to distinguish the positive-electrode connecting pieces 80 according to the types of the semiconductor modules to which the connecting pieces are connected. In other words, the positive-electrode connecting pieces that are connected to the positive-electrode terminals 36 of the semiconductor modules of the first inverter 20 are designated by a reference numeral 80*a*, the positive-electrode connecting pieces that are connected to the positive-electrode terminals 48 of the semiconductor modules of the second inverter 22 are designated by a reference numeral 80*b*, and the positive-electrode connecting pieces that are connected to the positive-electrode terminals 28 of the semiconductor modules of the boost converter 18 are designated by a reference numeral 80*c*.

In addition, for convenience of the following description, the positive-electrode bus bar portion 78 is virtually divided into regions 94, 96 and 98 which respectively correspond to the positive-electrode connecting pieces 80*a*, 80*b* and 80*c*, which are distinguished as described above. The regions are three regions that are surrounded by dot-and-dash lines as shown in FIG. 6, for example. The boundaries between the regions 94, 96 and 98 are shown perpendicular to the edge 82 in FIG. 6 for the sake of convenience. The region 94 of the positive-electrode bus bar portion, to which the positive-electrode connecting pieces 80*a* are connected, is a region that is defined corresponding to the semiconductor modules 34 of the first inverter 20, and is hereinafter referred to as "first inverter corresponding region 94." The region 96 of the positive-electrode bus bar portion, to which the positive-electrode connecting pieces 80*b* are connected, is a region that is defined corresponding to the semiconductor modules 46 of the second inverter 22, and is hereinafter referred to as "second inverter corresponding region 96." The region 98 of the positive-electrode bus bar portion, to which the positive-electrode connecting pieces 80*c* are connected, is a region that is defined corresponding to the semiconductor modules 26 of the boost converter 18, and is hereinafter referred to as "boost converter corresponding region 98." The positive-electrode bus bar portion 78 has three virtual regions 94, 96 and 98 that are arranged in the longitudinal direction of the bus bar portion, that is, in the direction in which the semiconductor modules are stacked.

The power converter circuits, in other words, the first and second inverters 20 and 22 and the boost converter 18 are separately controlled. The terminals of the semiconductor modules of these power converter circuits are all connected to the positive and negative-electrode connecting plates 66 and 70. Thus, a surge voltage that is generated in one power converter circuit may affect the other power converter circuits via the connecting plates 66 and 70 and interfere with the control. Especially, in the case of the semiconductor module unit 58, because the semiconductor modules 26, 34 and 46 and the cooling plates 60 are stacked to simplify the structure of the cooler and because the entire size is reduced, the distance between the power converter circuits is small. Interference of surge voltage tends to occur between the first inverter 20 and the second inverter 22.

In the power converter 10, the positive-electrode connecting plate 66 has means to increase the length of the current paths between the power converter circuits to prevent interference between the power converter circuits. Specifically, the bus bar portion 78 of the positive-electrode connecting plate 66 has a slit 100 between the first inverter corresponding region 94 and the boost converter corresponding region 98, and a slit 102 between the second inverter corresponding region 96 and the boost converter corresponding region 98. The slit 100 extends inward from the edge 82 of the positive-electrode bus bar portion 78, which faces the positive-electrode terminals of the semiconductor modules, along the boundary between the first inverter corresponding region 94 and the boost converter corresponding region 98. The slit 102 extends inward from the edge 82 of the positive-electrode bus bar portion along the boundary between the second inverter corresponding region 96 and the boost converter corresponding region 98. As a result, the length of the current paths between the power converter circuits increases as they go around the slit 100 or 102. Even when the positive-electrode connecting pieces 80 as connecting members are arranged at equal spaces, the current paths between the corresponding regions 94, 96 and 98 can be longer than the current paths between connecting members that are included in one corresponding region. Because the slits 100 and 102 increase the length of the current paths between the power converter circuits, a surge voltage that is generated in one power converter circuit is attenuated while being transferred to another electric power circuit, whereby interference is prevented.

In addition, the slits 100 and 102 are provided in the positive-electrode bus bar portion 78 with two capacitor connection spots out of the positive-electrode bus bar portion 78 with two capacitor connection spots 84 and the negative-electrode bus bar portion 86 with one capacitor connection spot 92, and the capacitor connection spots 84 are located in the vicinity of the extensions of the slits 100 and 102. Thus, because the distance from each terminal to the capacitor connection spots 84 can be shorter and because the length of the current path between a terminal that faces the first inverter corresponding region 94 and a terminal that faces the boost converter corresponding region 98 can be longer by a slit in contrast to the case where the capacitor connection spots 84 are located together in a position at an end of the bus bar portion in the direction in which the connecting members are aligned, for example, the influence of a surge voltage can be suitably reduced.

The length of the slit 100 can be determined based on the current that will flow between the first inverter corresponding region 94 and the boost converter corresponding region 98, and the upper limit of the amount of heat generation from the positive-electrode connecting plate 66. Heat resistance requirements have been determined for each of the parts and members around the positive-electrode connecting plate 66, and the upper limit of the amount of heat generation from the positive-electrode connecting plate 66 can be set to meet the requirements. When the length of the slit 100 is increased, the width of the portion of the positive-electrode bus bar portion 78 that is narrowed because of the slit 100 decreases and the amount of heat generation from this portion increases. The length of the slit 100 is determined so that the amount of heat generation from the portion cannot exceed the upper limit that is determined as described above. The length of the slit 102 can be determined in the same manner.

The positive-electrode connecting pieces 80 of the positive-electrode connecting plate 66 can be regarded as being divided and formed by forming a plurality of slits along an edge of the connecting plate. However, the slits 100 and 102 should be discriminated from these slits. Each of the slits 100 and 102 extends further into the connecting plate from the bottom of one of the slits that divide the connecting pieces.

Figure 8:
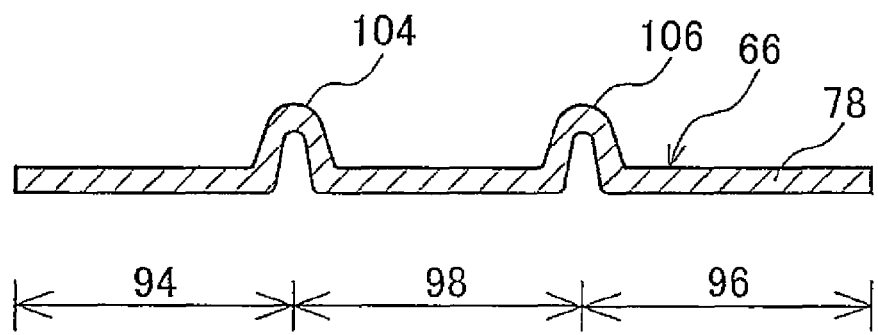
FIG. 8 is a cross-sectional view that illustrates another configuration of the positive-electrode connecting plate.

FIG. 8 is a diagram that illustrates another example of the means to increase the length of the current paths between the power converter circuits. A curved portion 104 is provided, instead of the slit 100 as described above, between the first inverter corresponding region 94 and the boost converter corresponding region 98. In addition, a curved portion 106 is provided, instead of the slit 102 as described above, between the second inverter corresponding region 96 and the boost converter corresponding region 98. Each of the curved portions 104 and 106 is a portion formed by bulging a portion of the flat plate surface of the positive-electrode bus bar portion 78 in the vicinity of the edge 82 of the positive-electrode bus bar portion 78. By providing the curved portions 104 and 106, the length of the current paths between the power converter circuits can be longer than that in a plate-like planar configuration. In addition, even when the connecting members are arranged at equal spaces, the current paths between the corresponding regions 94, 96 and 98 can be longer than the current paths between connecting members that are included in one corresponding region. The current paths are made longer as they are curved along the curved portion 104 or 106, and interference that is caused by surge voltage is prevented.

Although the negative-electrode connecting plate 70 has no means to increase the length of the current paths, such as the slits, in the power converter 10, the negative-electrode connecting plate 70 may have such means as in the case with the positive-electrode connecting plate 66.

Figure 9:
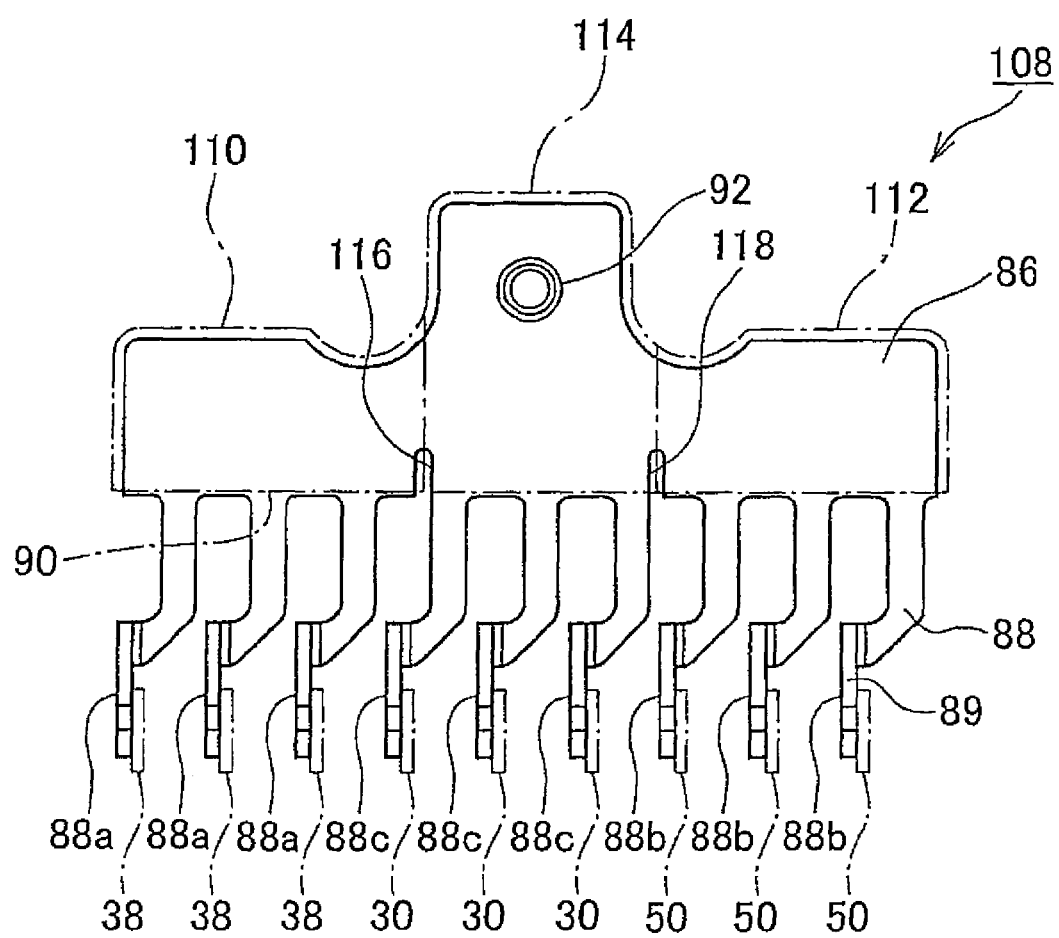
FIG. 9 is a plan view that illustrates another configuration of the negative-electrode connecting plate.

FIG. 9 is a diagram that illustrates the configuration of a negative-electrode connecting plate 108 that is provided with slits. Components in common with the negative-electrode connecting plate 70 are designated by the same reference numerals and their description is omitted. Suffixes "a," "b" and "c" are attached to the reference numeral 88 to distinguish the negative-electrode connecting pieces 88 according to the types of the semiconductor modules to which the connecting pieces are connected. In other words, the negative-electrode connecting pieces that are connected to the negative-electrode terminals 38 of the semiconductor modules of the first inverter 20 are designated by a reference numeral 88a, the negative-electrode connecting pieces that are connected to the negative-electrode terminals 50 of the semiconductor modules of the second inverter 22 are designated by a reference numeral 88b, and the negative-electrode connecting pieces that are connected to the negative-electrode terminals 30 of the semiconductor modules of the boost converter 18 are designated by a reference numeral 88c.

In addition, for convenience of the following description, the negative-electrode bus bar portion 86 is virtually divided into regions 110, 112 and 114 which respectively correspond to the negative-electrode connecting pieces 88a, 88b and 88c, which are distinguished as described above. The regions are regions that are surrounded by dot-and-dash lines as shown in FIG. 9, for example. The boundaries between the regions 110, 112 and 114 are shown perpendicular to the edge 90 in FIG. 9 for the sake of convenience. The region 110 of the negative-electrode bus bar portion, to which the negative-electrode connecting pieces 88a are connected, is a region that is defined corresponding to the semiconductor modules 34 of the first inverter 20, and is hereinafter referred to as "first inverter corresponding region 110." The region 112 of the negative-electrode bus bar portion, to which the negative-electrode connecting pieces 88b are connected, is a region that is defined corresponding to the semiconductor modules 46 of the second inverter 22, and is hereinafter referred to as "second inverter corresponding region 112." The region 114 of the negative-electrode bus bar portion, to which the negative-electrode connecting pieces 88c are connected, is a region that is defined corresponding to the semiconductor modules 26 of the boost converter 18, and is hereinafter referred to as "boost converter corresponding region 114." The negative-electrode bus bar portion 86 has three virtual regions 110, 112 and 114 that are arranged in the longitudinal direction of the bus bar portion, that is, in the direction in which the semiconductor modules are stacked.

The negative-electrode connecting plate 108 also has means to increase the length of the current paths between the power converter circuits to prevent interference between the power converter circuits as in the case with the positive-electrode connecting plate 66. Specifically, the bus bar portion 86 of the negative-electrode connecting plate 108 has a slit 116 between the first inverter corresponding region 110 and the boost converter corresponding region 114, and a slit 118 between the second inverter corresponding region 112 and the boost converter corresponding region 114. The slit 116 extends inward from the edge 90 of the negative-electrode bus bar portion 86, which faces the negative-electrode terminals of the semiconductor modules, along the boundary between the first inverter corresponding region 110 and the boost converter corresponding region 114. The slit 118 extends inward from the edge 90 of the negative-electrode bus bar portion along the boundary between the second inverter corresponding region 112 and the boost converter corresponding region 114. As a result, the length of the current paths between the power converter circuits increases as they go around the slit 116 or 118. Even when the negative-electrode connecting pieces 88 as connecting members are arranged at equal spaces, the current paths between the corresponding regions 110, 112 and 114 can be longer than the current paths between connecting members that are included in one corresponding region. Because the slits 116 and 118 increase the length of the current paths between the power converter circuits, a surge voltage that is generated in one power converter circuit is attenuated while being transferred to another electric power circuit, whereby interference is prevented. The length of the slits 116 and 118 can be determined based on the heat resistance requirements of the parts around the negative-electrode connecting plate 108 and the amount of heat generation from the negative-electrode connecting plate 108 as in the case with the slits 100 and 102 of the positive-electrode connecting plate 66.

The negative-electrode connecting plate 108 with slits may be employed on the negative side with a connecting plate without slits employed on the positive side.

Figure 10A:
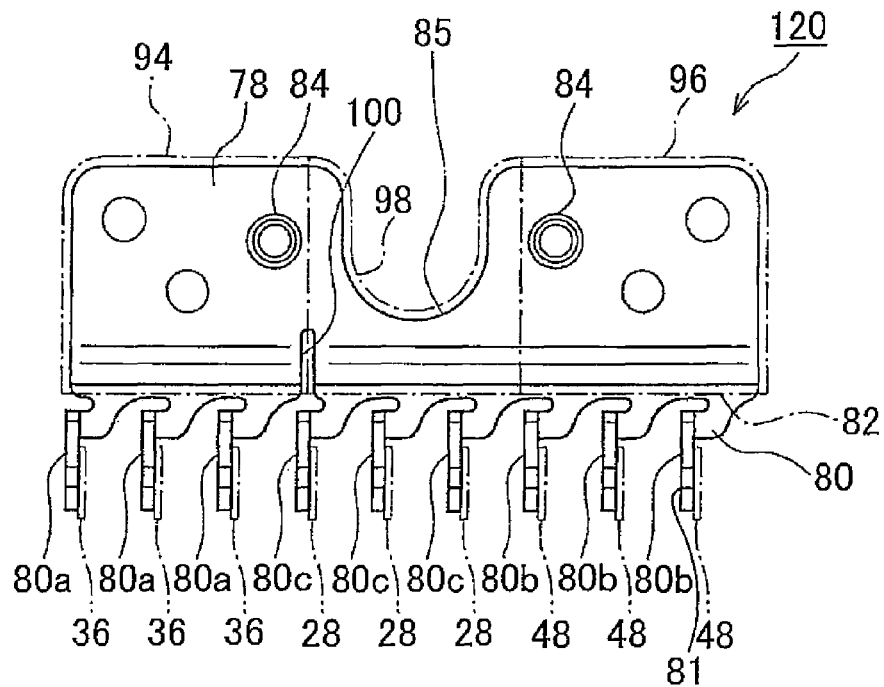
FIG. 10A is a plan view that illustrates yet another configuration of the positive-electrode connecting plate.
Figure 10B:
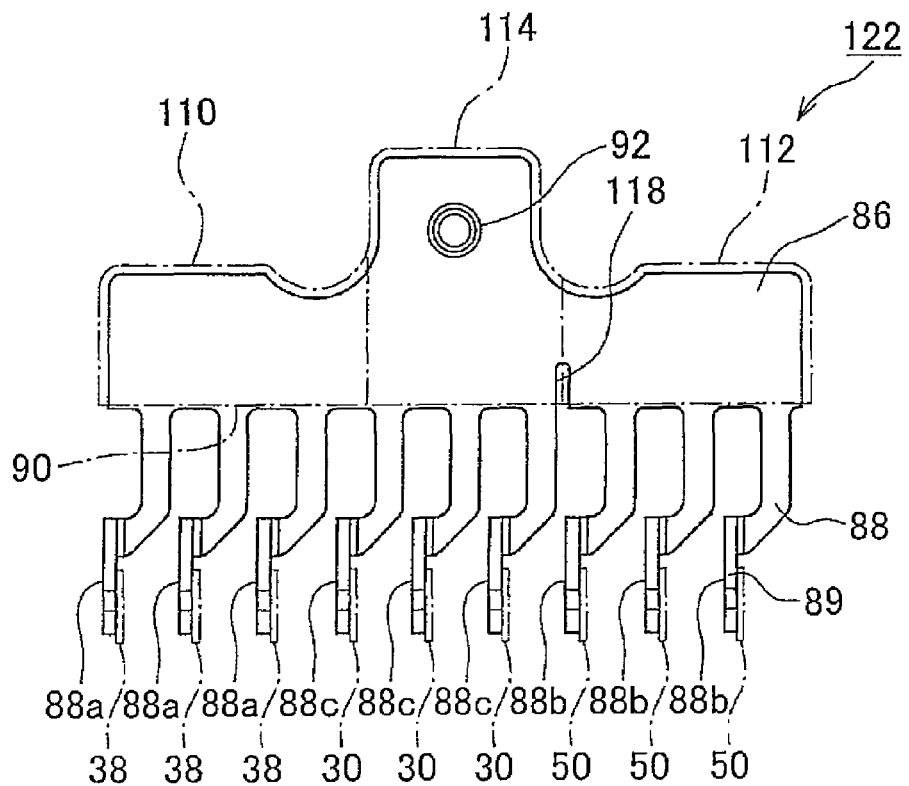
FIG. 10B is a plan view that illustrates yet another configuration of the negative-electrode connecting plate.

In addition, when slits are provided both in the positive-electrode connecting plate and the negative-electrode connecting plate, the positive-electrode connecting plate and the negative-electrode connecting plate may have one slit each. One example is shown in FIG. 10A and FIG. 10B. Components in common with the positive and negative-electrode connecting plates, which are described above, are designated by the same reference numerals and their description is omitted. A positive-electrode connecting plate 120 has the slit 100 between the first inverter corresponding region 94 and the boost converter corresponding region 98, and has no slit between the second inverter corresponding region 96 and the boost converter corresponding region 98. In contrast, a negative-electrode connecting plate 122 has no slit between the first inverter corresponding region 110 and the boost converter corresponding region 114, and has the slit 118 between the second inverter corresponding region 112 and the boost converter corresponding region 114. Contrary to the aspect that is shown in FIG. 10A and FIG. 10B, the positive-electrode connecting plate may have only the same slit 102 as that of the positive-electrode connecting plate 66 that is shown in FIG. 6, and the negative-electrode connecting plate may have only the same slit 116 as that of the negative-electrode connecting plate 108 that is shown in FIG. 9. When slits are provided along some of a plurality of boundaries, the slits are preferably provided between different power converter circuits between the positive side and negative side as described above.

Figure 11:
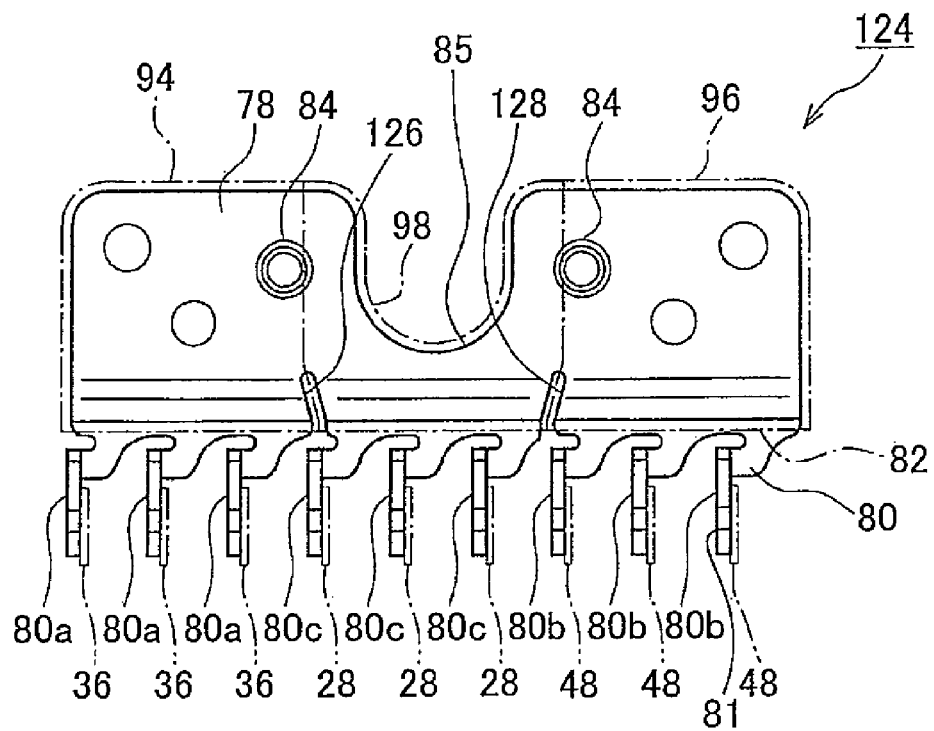
FIG. 11 is a plan view that illustrates still yet another configuration of the positive-electrode connecting plate.

While the slits 100 and 102 are linearly formed perpendicular to the direction in which the semiconductor modules are stacked in the above embodiment, the slits 100 and 102 may be inclined with respect to the direction perpendicular to the direction in which the semiconductor modules are stacked, or may be formed in a curved or zigzag configuration. For example, two slits 126 and 128 may extend inward from the edge 82 such that the distance between them increases as the distance from the edge 82 increases, as in a positive-electrode connecting plate 124 that is shown in FIG. 11. Among the components of the positive-electrode connecting plate 124, the same components as those of the positive-electrode connecting plate 66, which is shown in FIG. 6, are designated by the same reference numerals and their description is omitted. Preferably, the slits 126 and 128 are inclined toward the capacitor connection spots 84.

The two slits may have different lengths.

The arrangement of the power converter circuits (first converter, boost converter and second converter) is not limited to that of the above embodiment. For example, the semiconductor module group that constitutes the first converter, the semiconductor module group that constitutes the second inverter, and the semiconductor module group that constitutes the boost converter may be stacked or arranged in this order. In this case, the length of the slit between the second inverter corresponding region and the boost converter corresponding region may be smaller than that of the slit between the first inverter corresponding region and the second inverter corresponding region, or no slit may be provided between the first inverter corresponding region and the second inverter corresponding region. In this case, even when the influence of a surge voltage from the boost converter is large, the influence of the surge voltage can be suitably prevented without increasing the length of the current paths because the boost converter and the first inverter are separated from each other on the bus bar. The semiconductor module group that constitutes the first inverter and the semiconductor module group that constitutes the second inverter may be reversed relative to each other.

While the power converter 10 has three power converter circuits, that is, two inverters and one boost converter, the present invention is applicable to a power converter which has two or more than three power converter circuits. Means to increase the length of current paths, such as a slit, is provided between converter circuit corresponding regions on the bus bar, which correspond to power converter circuits in which interference of surge voltage tends to occur. Slits or the like may be provided along all the boundaries between adjacent converter circuit corresponding regions.

Figure 12:
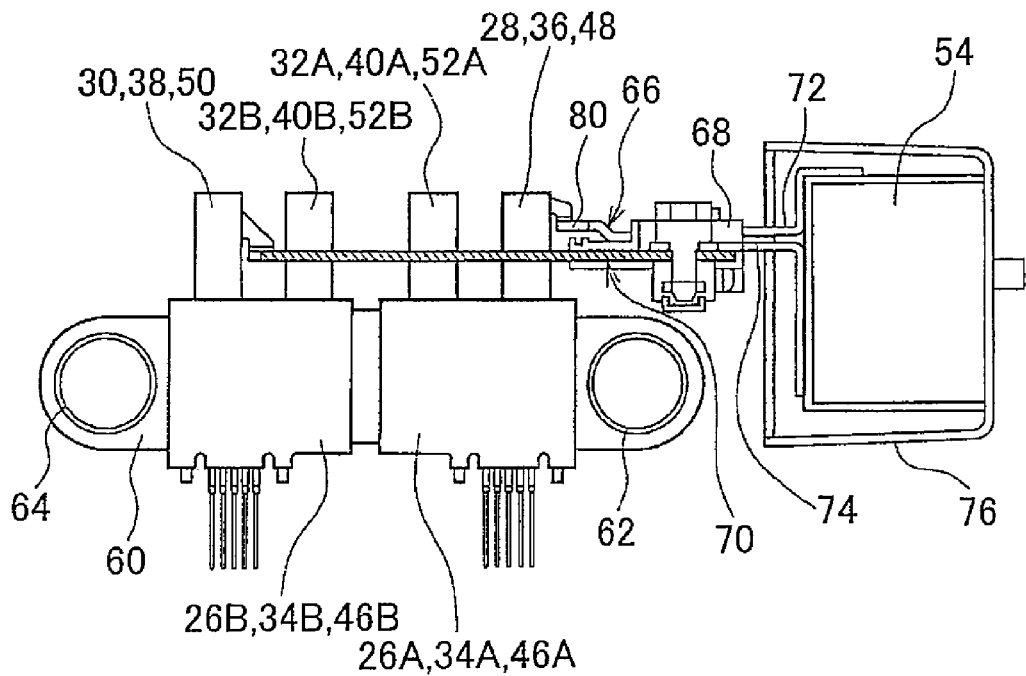
FIG. 12 is a side cross-sectional view that illustrates a part of a power converter of different configuration.

In the above embodiment, the semiconductor modules 26, 34 and 46 have two power transistors each, and have the positive-electrode terminals 28, 36 and 48, the negative-electrode terminals 30, 38 and 50, and the output-electrode terminals 32, 40 and 52, respectively. However, the semiconductor module unit may be constituted by combining semiconductor modules that have one power transistor each. For example, a configuration in which two semiconductor modules, each having one power transistor, are used in combination as shown in FIG. 12 may be employed. Specifically, each of the semiconductor modules 34, which are described above, may be replaced by two semiconductor modules 34A and 34B, each having one power transistor. One semiconductor modules 34A includes a positive-electrode terminal 36 and an output-electrode terminal 40A, and the other semiconductor modules 34B includes a negative-electrode terminal 38 and an output-electrode terminal 40B. The output-electrode terminal 40A and the output-electrode terminal 40B are electrically connected to each other. Similarly, the semiconductor modules 26 and 46 may be constituted by combining two semiconductor modules 26A and 26B, and two semiconductor modules 46A and 46B, respectively. In addition, the three semiconductor modules 34 of the first inverter 20, which are provided for each of the phases, may be integrated. That is, a semiconductor module that has power transistors for the three phases may be constituted. The same applies to the second inverter 22.

The power converter of the present invention may have the following configuration. (1) The power converter has a first inverter that has three semiconductor modules, a second inverter that has three semiconductor modules, and connecting plates that connect the terminals of the semiconductor modules that constitute the first and second inverters with a capacitor. The semiconductor modules of the first and second inverters are stacked, and each of the connecting plates includes a bus bar portion that extends in the direction in which the semiconductor modules are stacked, and connecting pieces that extend from the bus bar portion and connect the bus bar portion with the terminals of the semiconductor modules. The bus bar portion includes a first inverter corresponding region that is a portion that has the connecting pieces that are connected to the terminals of the semiconductor modules of the first inverter, and a second inverter corresponding region that is a portion that has the connecting pieces that are connected to the terminals of the semiconductor modules of the second inverter. The bus bar portion has a slit that extends beyond the bases of the connecting pieces and is provided between the first inverter corresponding region and the second inverter corresponding region.

(2) In the power converter that is described in (1) above, at least one semiconductor module that is included in a boost converter is located between the semiconductor modules of the first inverter and the semiconductor modules of the second inverter in the direction in which the semiconductor modules are stacked. Each of the connecting plates may have a connecting piece that connects the bus bar portion with the terminal of the semiconductor module of the boost converter, and the bus bar portion may include a boost converter corresponding region that is a portion that has the connecting piece that is connected to the terminal of the semiconductor module of the boost converter. Each of the connecting plates may have at least one slit between the first inverter corresponding region and boost converter corresponding region or between the second inverter corresponding region and the boost converter corresponding region.

Alternatively, the power converter of the present invention may have the following configuration. (3) The power converter has a first inverter that has three semiconductor modules, a second inverter that has three semiconductor modules, and connecting plates that connect the terminals of the semiconductor modules that constitute the first and second inverters with a capacitor. The semiconductor modules are stacked each other, and each of the connecting plates has connecting pieces that are divided by first slits formed along an edge thereof that extends in the direction in which the semiconductor modules are stacked and are connected to a corresponding one of the terminals of the semiconductor modules, and a second slit extends beyond the bottom of at least one of the first slits that is located between the connecting pieces that relates to the first inverter and the connecting pieces that relates to the second inverter.

Alternatively, the power converter of the present invention may have the following configuration. (4) The power converter has a first inverter that has three semiconductor modules, a second inverter that has three semiconductor modules, a boost converter that has at least one semiconductor module, and connecting plates that connect the terminals of the semiconductor modules of the first and second inverters and the boost converter with a capacitor. The semiconductor modules are stacked such that the semiconductor modules of the boost converter are located between the semiconductor modules of the first inverter and the semiconductor modules of the second inverter. Each of the connecting plates has connecting pieces that are divided by first slits that are formed along an edge thereof that extends in the direction in which the semiconductor modules are stacked and are connected to a corresponding one of the terminals of the semiconductor modules, and a second slit extends beyond the bottom of at least one of the first slits that divides the connecting pieces that relate to the first inverter and the connecting pieces that relate to the boost converter and the first slits that divides the connecting pieces that relate to the second inverter and the connecting pieces that relate to the boost converter.

The invention claimed is:
1. A power converter, comprising:
a plurality of power converter circuits, each of which includes at least one semiconductor module, wherein the semiconductor modules are stacked, bus bars in common with the semiconductor modules that connect the stacked semiconductor modules with a capacitor, and connecting members that are arranged along an edge of each of the bus bars and connect the edge of the bus bar with terminals of the semiconductor modules, wherein each of the bus bars includes converter circuit corresponding regions that are defined for each of the power converter circuits that include the semiconductor modules that are connected to the bus bar by the connecting members, and wherein at least one of the bus bars includes a slit that extends from the edge of the bus bar along at least one of the boundaries between the converter circuit corresponding regions, wherein the plurality of power converter circuits include a first power converter circuit that includes a first inverter that is provided corresponding to a first rotating electric machine, and a second power converter circuit that includes a second inverter that is provided corresponding to a second rotating electric machine, and wherein the converter circuit corresponding regions of each of the bus bars include a first inverter corresponding region that corresponds to the first inverter and a second inverter corresponding region that corresponds to the second inverter, and the slit is provided between the first inverter corresponding region and the second inverter corresponding region.

2. The power converter according to claim 1,
wherein one of the bus bars with the slit is connected to positive-electrode terminals of the semiconductor modules.

3. The power converter according to claim 1,
wherein one of the bus bars with the slit is connected to negative-electrode terminals of the semiconductor modules.

4. The power converter according to claim 1, wherein the plurality of power converter circuits further include a third power converter circuit that includes a boost converter that includes a semiconductor module which is located between the semiconductor module of the first inverter and the semiconductor module of the second inverter, and wherein the converter circuit corresponding regions of each of the bus bars include a boost converter corresponding region, and the slits that are provided between the first inverter corresponding region and the boost converter corresponding region and between the second inverter corresponding region and the boost converter corresponding region.

5. The power converter according to claim 4, wherein the slit that is provided between the first inverter corresponding region and the boost converter corresponding region has a length that is determined based on the current that will flow between the first inverter corresponding region and the boost converter corresponding region and the upper limit of the amount of heat generation from the bus bar, and the slit that is provided between the second inverter corresponding region and the boost converter corresponding region has a length that is determined based on the current that will flow between the second inverter corresponding region and the boost converter corresponding region and the upper limit of the amount of heat generation from the bus bar.

6. The power converter according to claim 1, wherein each of the bus bar that is connected to the positive-electrode terminals of the semiconductor modules and the bus bar that is connected to the negative-electrode terminals of the semiconductor modules has one of the slits.

7. A power converter, comprising:
a plurality of power converter circuits, each of which includes at least one semiconductor module, wherein the semiconductor modules are stacked, bus bars that connect terminals of the stacked semiconductor modules and connecting members that are arranged along an edge of each of the bus bars and connect the edge of the bus bar with a corresponding one of the terminals of the plurality of the power converter circuits, wherein each of the bus bars includes converter circuit corresponding regions that are defined for each of the power converter circuits that include the semiconductor modules that are connected to the bus bar by the connecting members, and wherein at least one of the bus bars includes a slit that extends from the edge of the bus bar along at least one of the boundaries between the converter circuit corresponding regions, wherein the plurality of power converter circuits include a first power converter circuit that includes a first inverter that is provided corresponding to a first rotating electric machine, and a second power converter circuit that includes a second inverter that is provided corresponding to a second rotating electric machine, and wherein the converter circuit corresponding regions of each of the bus bars include a first inverter corresponding region that corresponds to the first inverter and a second inverter corresponding region that corresponds to the second inverter, and the slit is provided between the first inverter corresponding region and the second inverter corresponding region.

8. A power converter, comprising:
a plurality of power converter circuits, each of which includes at least one semiconductor module, wherein the semiconductor modules are stacked, bus bars that connect terminals of the stacked semiconductor modules and connecting members that are arranged at equal spaces along an edge of each of the bus bars and connect the edge of the bus bar with a corresponding one of the terminals of the plurality of the power converter circuits, wherein each of the bus bars includes converter circuit corresponding regions that are defined for each of the power converter circuits that include the semiconductor modules that are connected to the bus bar by the connecting members, and wherein at least one of the bus bars includes a curved portion that is provided along at least one of the boundaries between adjacent converter circuit corresponding regions configured to increase the length of current paths between the adjacent converter circuit corresponding regions, wherein the plurality of power converter circuits include a first power converter circuit that includes a first inverter that is provided corresponding to a first rotating electric machine, and a second power converter circuit that includes a second inverter that is provided corresponding to a second rotating electric machine, and wherein the converter circuit corresponding regions of each of the bus bars include a first inverter corresponding region that corresponds to the first inverter and a second inverter corresponding region that corresponds to the second inverter, and the slit is provided between the first inverter corresponding region and the second inverter corresponding region.

9. The power converter according to claim 8, wherein the curved portion is formed by bulging a portion of a flat surface of the bus bar in the vicinity of an edge thereof.

10. A power converter, comprising:
a plurality of power converter circuits, each of which includes at least one semiconductor module, wherein the semiconductor modules are stacked, and
connecting plates that connect terminals of the stacked semiconductor modules,
wherein each of the connecting plates includes
bus bar portions that extend in the direction in which the semiconductor modules are stacked, and
connecting pieces that extend from the bus bar portion and connect the bus bar portion with the terminals of the semiconductor modules,
wherein the bus bar portion includes converter circuit corresponding regions that are defined for each of the power converter circuits that include the semiconductor modules that are connected via the connecting pieces, and
wherein at least one of the bus bar portions includes a slit that is formed along at least one of boundaries between the converter circuit corresponding regions and extends beyond the bases of the connecting pieces,
wherein the plurality of power converter circuits include a first power converter circuit that includes a first inverter that is provided corresponding to a first rotating electric machine, and a second power converter circuit that includes a second inverter that is provided corresponding to a second rotating electric machine, and
wherein the converter circuit corresponding regions of each of the bus bars include a first inverter corresponding region that corresponds to the first inverter and a second inverter corresponding region that corresponds to the second inverter, and the slit is provided between the first inverter corresponding region and the second inverter corresponding region.

* * * * *